(12) United States Patent
Ge et al.

(10) Patent No.: US 10,978,327 B2
(45) Date of Patent: Apr. 13, 2021

(54) MICRO-STRUCTURE TRANSFER SYSTEM

(71) Applicant: Hewlett-Packard Development Company, L.P., Spring, TX (US)

(72) Inventors: Ning Ge, Palo Alto, CA (US); Ya-Ling Chang, Palo Alto, CA (US); Helen A. Holder, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/332,147

(22) PCT Filed: Oct. 10, 2016

(86) PCT No.: PCT/US2016/056304
§ 371 (c)(1),
(2) Date: Mar. 11, 2019

(87) PCT Pub. No.: WO2018/070988
PCT Pub. Date: Apr. 19, 2018

(65) Prior Publication Data
US 2019/0229002 A1 Jul. 25, 2019

(51) Int. Cl.
*H01L 21/677* (2006.01)
*G03F 7/16* (2006.01)
*H01L 21/67* (2006.01)

(52) U.S. Cl.
CPC ........ *H01L 21/67721* (2013.01); *G03F 7/161* (2013.01); *H01L 21/67288* (2013.01); *H01L 21/67706* (2013.01)

(58) Field of Classification Search
CPC ......... H01L 21/67721; H01L 21/67288; H01L 21/67706; G03F 7/161
See application file for complete search history.

(56) References Cited

U.S. PATENT DOCUMENTS

| 6,428,156 B1 | 8/2002 | Waller et al. |
| 9,105,492 B2 | 8/2015 | Bibl et al. |
| (Continued) | | |

FOREIGN PATENT DOCUMENTS

| CN | 1853948 A | 11/2006 |
| CN | 102015297 A | 4/2011 |
| (Continued) | | |

OTHER PUBLICATIONS

Translation of RU-2318673-C1, published Mar. 2008 (Year: 2008).*

(Continued)

*Primary Examiner* — George R Koch
(74) *Attorney, Agent, or Firm* — Fabian VanCott (57) ABSTRACT

A micro-structure transfer system may include a printhead and a pressure control device to control a pressure of fluid coupled with the printhead. The pressure control device forms a meniscus of fluid at a number of nozzles defined within the printhead to pick up a number of micro-structures. A printhead for transferring micro-structures includes a number of fluid chambers, a number of nozzles defined in an orifice plate through which fluid may exit the chambers, and a pressure control device to control a pressure of fluid within each of the chambers. The pressure control device forms a meniscus of the fluid at a number of nozzles defined within the printhead to pick up a number of micro-structures.

20 Claims, 7 Drawing Sheets

(56) References Cited

U.S. PATENT DOCUMENTS

| | | | |
|---|---|---|---|
| 9,358,775 B2 | 6/2016 | Bower et al. | |
| 2007/0081052 A1 | 4/2007 | Lebron et al. | |
| 2009/0045354 A1 | 2/2009 | Sagmuller et al. | |
| 2009/0273621 A1* | 11/2009 | Folkers | B41J 2/165 |
| | | | 347/9 |
| 2013/0036928 A1 | 2/2013 | Rogers et al. | |
| 2013/0273695 A1 | 10/2013 | Menard et al. | |
| 2014/0271082 A1 | 9/2014 | Youngquist | |
| 2017/0036342 A1* | 2/2017 | Chen | B25J 15/008 |
| 2017/0263593 A1* | 9/2017 | Zou | H01L 33/0095 |

FOREIGN PATENT DOCUMENTS

| | | | |
|---|---|---|---|
| CN | 204278542 | 4/2015 | |
| CN | 105813602 | 7/2016 | |
| CN | 105818383 | 8/2016 | |
| KR | 1020100136538 | 12/2010 | |
| RU | 2318673 C1 * | 3/2008 | B41J 2/1755 |
| TW | 201505119 A | 2/2015 | |
| WO | WO-2009135099 A1 | 11/2009 | |
| WO | WO-2016060676 A1 | 4/2016 | |
| WO | WO-2016141215 | 9/2016 | |
| WO | WO-2016154956 | 10/2016 | |

OTHER PUBLICATIONS

LS60V Pick and Place Machine with Vision, 2016, < http://www.ddmnovastar.com/pick-and-place/automated-systems/ls60v-pick-and-place-machine-with-vision >.

Micro-Transfer-Printing (µTP), 2014, < http:/www.x-celeprint.com/micro-transfer-printing-%C2%B5tp/ >.

\* cited by examiner

MICRO-STRUCTURE TRANSFER SYSTEM

This application is a 371 of PCT/US2016/056304, filing date Oct. 10, 2016.

BACKGROUND

Micro- and nano-fabrication are processes of fabricating structures of micrometer and nanometer scales. Structures of this scale may be referred to as micro-structures. Micro-light emitting diodes (μLEDs) are LEDs fabricated at micrometer or smaller scales, and may be used in display devices to serve as individual pixel elements. The μLEDs provide greater contrast and faster response times, while consuming far less energy than other display device technologies. However, due to the extremely small size of micro-structures such as μLEDs, manufacturing electrical devices such as a μLED display device that includes the micro-structures may be difficult due to their extremely small size. This may prove particularly difficult if the micro-structures are transferred from one substrate to another during the manufacturing process.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

As mentioned above, manufacturing electrical devices that include micro-structures may prove difficult due to the extremely small size of the micro-structures. Tools used to pick up the micro-structures may have tolerances that may be expensively-impermissive to form, and, in turn, use to make devices such as μLED display devices. Further, tolerances associated with the ability to pick up and place the micro-structures in an intended position and orientation may be difficult to reproduce on a massive manufacturing scale. Still further, in some pick and place processes, significant post-placing processes have proven to be time consuming and add to the expense of the manufacturing of the micro-structure-based device. These processes are simply too expensive and produce too little output of finished micro-structure-based products that they are abandoned as viable economic manufacturing processes.

Thus, examples described herein provide a micro-structure transfer system that may include a printhead and a pressure control device to control a pressure of fluid coupled with the printhead. The pressure control device forms a meniscus of fluid at a number of nozzles defined within the printhead to pick up a number of micro-structures. The printhead further includes a number of fluid ejection elements to deposit the micro-structures on a target substrate by ejecting the fluid through the nozzles. The pressure control device includes a number of pumps, a number of resistive elements, or combinations thereof to form the meniscus.

A testing device may be included to test the micro-structures at a wafer to produce wafer map information defining operability of each of the micro-structures. The micro-structure transfer system, based on the wafer map information, actuates a number of actuators of the printhead to deposit functioning micro-structures on a target substrate, and actuates the actuators to deposit inoperable micro-structures in a disposal area.

Each of the actuators of the printhead are individually addressable to activate individual resistive elements based on the wafer map information. The micro-structure transfer system deposits the micro-structures on the target substrate based on a pixel pitch defining a position of the micro-structures on the target substrate. The micro-structure transfer system may further include a carriage to move the printhead in at least two coordinate directions.

Examples described herein also provide a printhead for transferring micro-structures. The printhead includes a number of fluid chambers, a number of nozzles defined in an orifice plate or top hat through which fluid may exit the chambers, and a pressure control device to control a pressure of fluid within each of the chambers. The pressure control device forms a meniscus of the fluid at a number of nozzles defined within the printhead to pick up a number of micro-structures. The printhead may further include a number of actuators in each of the chambers to assist the pressure control device to form the meniscus, and create pressure within the chambers to eject fluid from the chambers through the nozzles. The actuators are individually selectively controlled to selectively place the micro-structures along a length of a target substrate.

Examples described herein further provide a method of transferring micro-structures including, with a pressure control device of a printhead, controlling a pressure of fluid within a number of fluid channels defined in the printhead to form a meniscus of the fluid protruding from a number of nozzles defined in the printhead, and picking a number of micro-structures from a wafer via the meniscus using adhesive forces between the fluid and the micro-structure. The method further includes actuating a number of actuators of the printhead to deposit the micro-structures on a target substrate, and disposing of deficient micro-structures. The pressure control device utilizes a number of spring bags, forms, pumps, the resistive elements, or combinations thereof to form the meniscus. In one example, the pressure control device may be included within or may be a part of a fluid source. The method may further include testing the micro-structures at the wafer to produce wafer map information defining operability of each of the micro-structures, and, based on wafer map information, actuating a number of actuators of the printhead to deposit the micro-structures in a disposal area.

Examples described herein are directed to μLEDs and manufacturing of μLED display devices using a printhead-assisted pick and place manufacturing process. However, the printhead-assisted pick and place manufacturing process may be used in connection with any type of micro-structure or in the manufacturing of any device in which the micro-structures may be included.

Even still further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Figure 1:
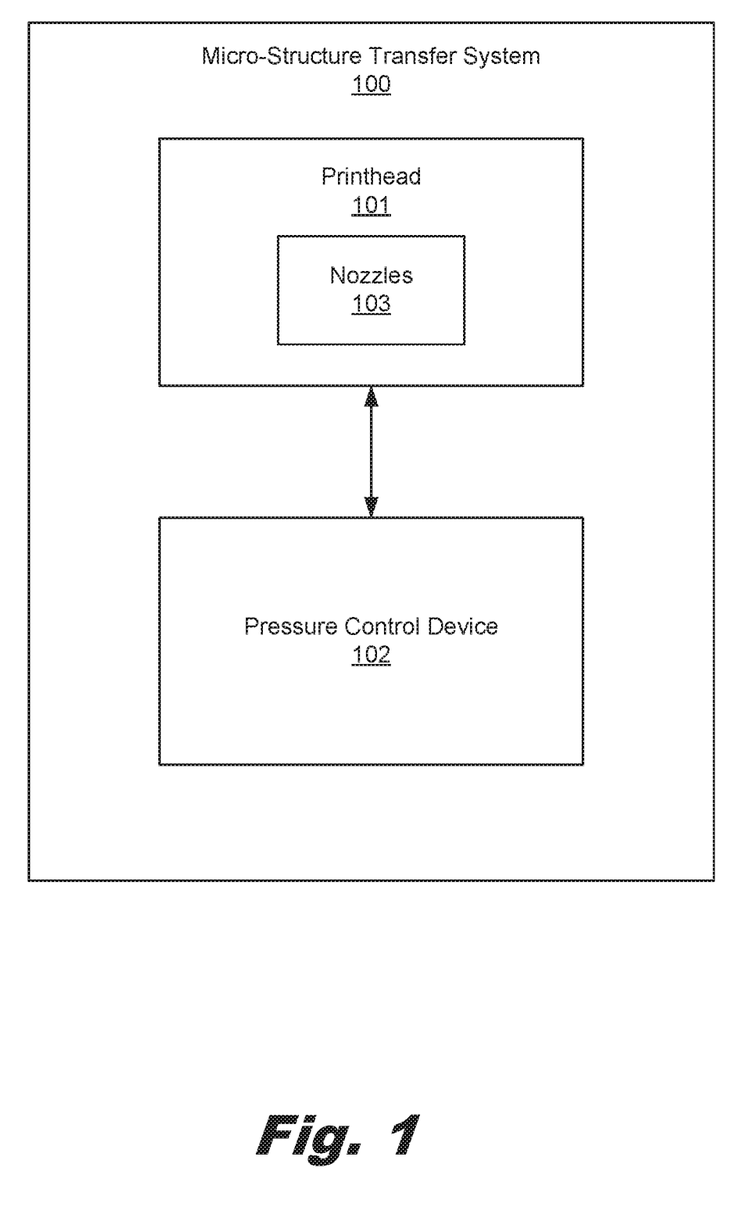
FIG. 1 is a block diagram of a micro-structure transfer system, according to one example of the principles described herein.

Turning now to the figures, FIG. 1 is a block diagram of a micro-structure transfer system (100), according to one example of the principles described herein. The micro-structure transfer system (100) may include a printhead (101) including a number of nozzles (103) to eject fluid from the printhead (101), and a pressure control device (102) to control a pressure of fluid coupled with the printhead (101). The fluid ejected from the printhead (101) may be any fluid that does not interfere with the functioning of the micro-structure being transferred by the micro-structure transfer system (100), and does not interfere with the functioning of the device into which the micro-structures are being placed. In one example, the fluid may be pure molecular $H_2O$ (i.e., water).

The fluid may also be chosen based on its adhesive properties. As will be described in more detail below, the micro-structure transfer system (100) uses the adhesive properties of the fluid to pick up, convey, and place micro-structures onto a target substrate. Adhesion is a physical property of a fluid that defines the fluid's tendency to cling to another substance such as the materials that make up the micro-structures. The forces that cause adhesion between the fluid and the micro-structures may include intermolecular forces responsible for the function of chemical adhesion, dispersive adhesion, diffusive adhesion, or combinations thereof. Thus, the fluid may be chosen based on the adhesive properties of the fluid as well as the adhesive interaction of the fluid relative to a number of materials from which the micro-structure is made.

In another example, the fluid may be chosen based on its ability to be discharged out of a chamber and nozzle of the printhead (101). In one example, the printhead (101) may be a thermal printhead where a resistive element acting as a heating device is disposed within the chamber. When the resistive element is actuated, a rapid vaporization of the fluid occurs in the chamber, and a drive bubble forms. The drive bubble creates an increased pressure within the chamber, and forces the fluid out the nozzle coupled to the chamber. In the example of a thermal printhead, the fluid has a volatile component in order to form the drive bubble through vaporization.

In another example, the printhead (101) may be a piezoelectric printhead where a piezoelectric material is disposed in a fluid-filled chamber. A voltage is applied to the piezoelectric material, and, due to the properties of the piezoelectric material, the piezoelectric material changes shape. The change in shape of the piezoelectric material generates a pressure pulse in the fluid, which forces a droplet of ink from the nozzle. In the example of a piezoelectric printhead, the fluid may be of a wider range of fluids since no volatile component is included in order to drive the fluid from the chamber through the nozzle.

In the above examples, any number of chambers and nozzles may be included within the printhead (101). In one example, more than a thousand chambers and corresponding nozzles may be included in the printhead (101). Further, a number of printheads (101) may be included in an array such as a page wide array. In this example, printheads (101) in the page wide array may include at least over ten thousand and possibly hundreds of thousands of chambers and corresponding nozzles. In this configuration, the transfer of micro-structures during manufacturing of a micro-structure-based device may provide a finished product in a less expensive and less time consuming manner. Further, in the examples herein, the device used to discharge fluid from the chamber and through the nozzle may be referred to an actuator. The examples of the resistive elements and the piezoelectric material described above, as well as other devices, may be referred to herein as actuators.

The pressure control device (102) controls a back pressure within a fluid slot of a fluid delivery system of the printhead (101). In one example, the pressure control device (102) may be a pump or other device that may move the fluid through the fluid slot, into the chamber (212), and through other channels within the printhead (101). The pressure control device (102) may include a pressure sensor for identifying pressures within the chamber (212), the fluid slot (217), and other portions of the printhead (101) in order to determine if the pressure control device (102) should increase or decrease the amount of pressure in these areas of the printhead (101). In one example, the pressure control device may be included within or may be a part of a fluid source.

In one example, the pressure control device (102) is used to form a meniscus of fluid at the exterior of each of the nozzles such that fluid protrudes from the nozzles. The meniscus of fluid may then be used to pick up a number of micro-structures. The menisci formed at each nozzle is formed due to the surface tension between the fluid and the orifice of the nozzles which results in a protruding convex meniscus. A convex meniscus is formed when the molecules or particles of the liquid have a stronger attraction to each other through their cohesive properties than to the material of the nozzles.

In one example, the micro-structure transfer system (100) may use the meniscus of fluid to pick up a number of micro-structures from any array of micro-structures through the adhesive properties of the fluid as the printhead is moved toward the array of micro-structures. In this example, the array of micro-structures may be an array of micro-structures as manufactured on a wafer. In this manner, the micro-structures are not moved to an intermediary substrate or position before the pick and place process performed by the micro-structure transfer system (100).

In another example, a combination of the pressure control device (102) and the actuators within the chambers of the printhead (101) may be used to form the meniscus. In this example, the actuators may be at least partially actuated to assist in the formation of the menisci at each nozzle. Thus, the pressure control device (102) forms a meniscus of fluid at each of a number of nozzles (103) defined within the printhead (101) to pick up a number of micro-structures. More details regarding the micro-structure transfer system (100) will now be described in connection with FIGS. 2 and 3.

Figure 2:
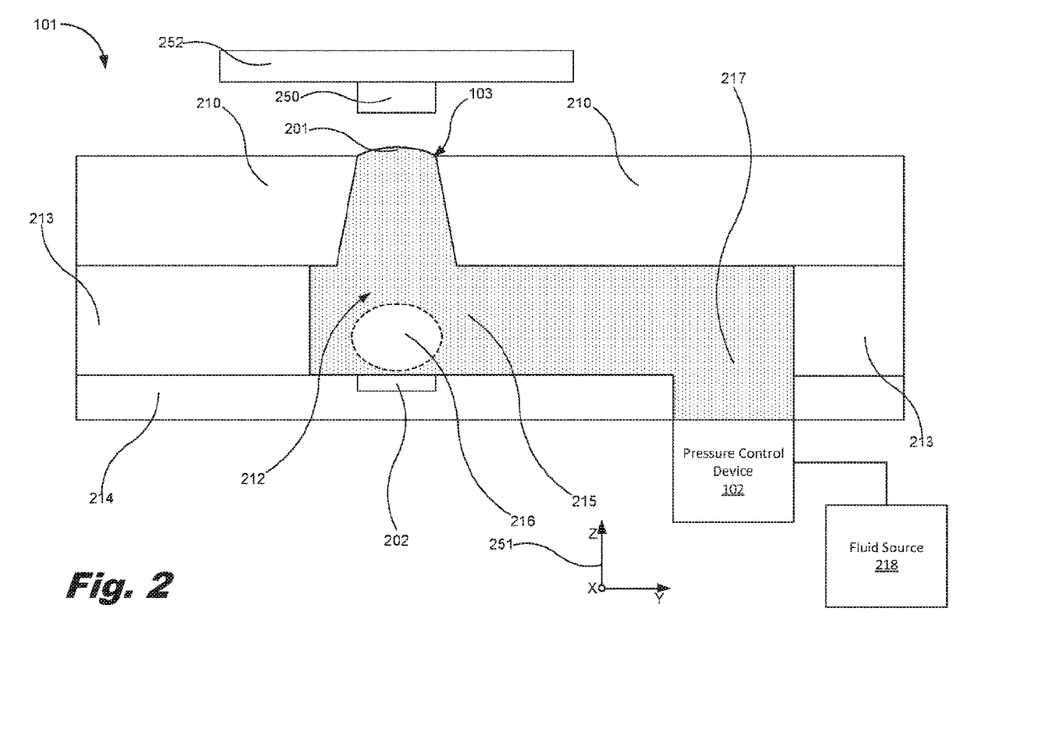
FIG. 2 is a block diagram of a portion of a printhead of the micro-structure transfer system of FIG. 1 depicting a meniscus, according to one example of the principles described herein.
Figure 3:
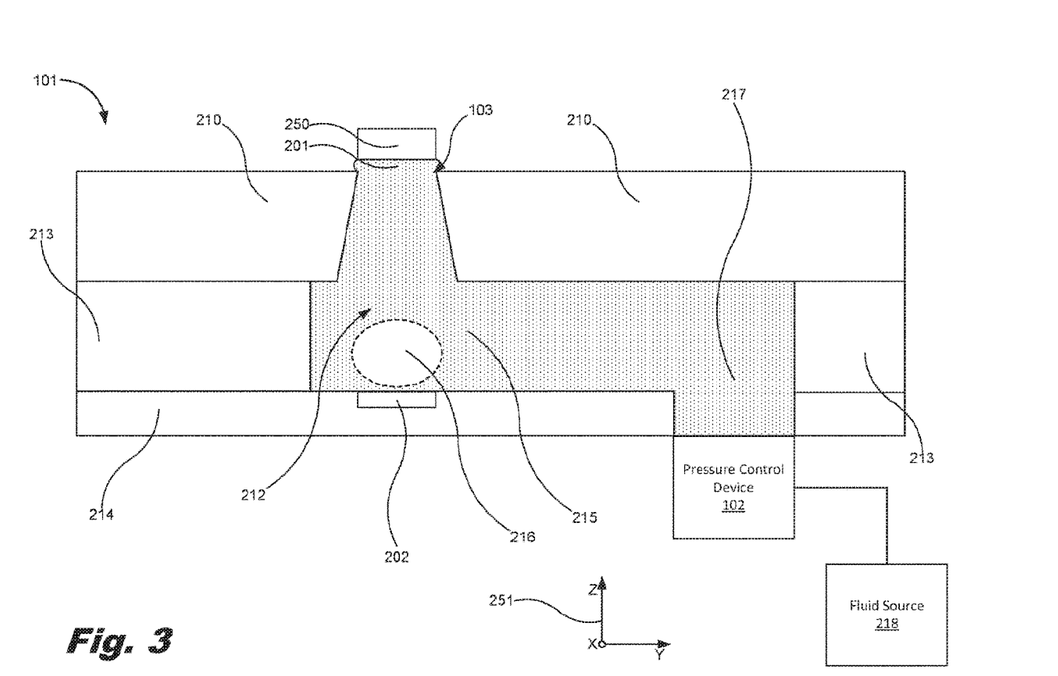
FIG. 3 is a block diagram of a portion of a printhead of the micro-structure transfer system of FIG. 1 depicting an adhesion of a micro-structure device to a meniscus formed at the printhead, according to another example of the principles described herein.
Figure 4:
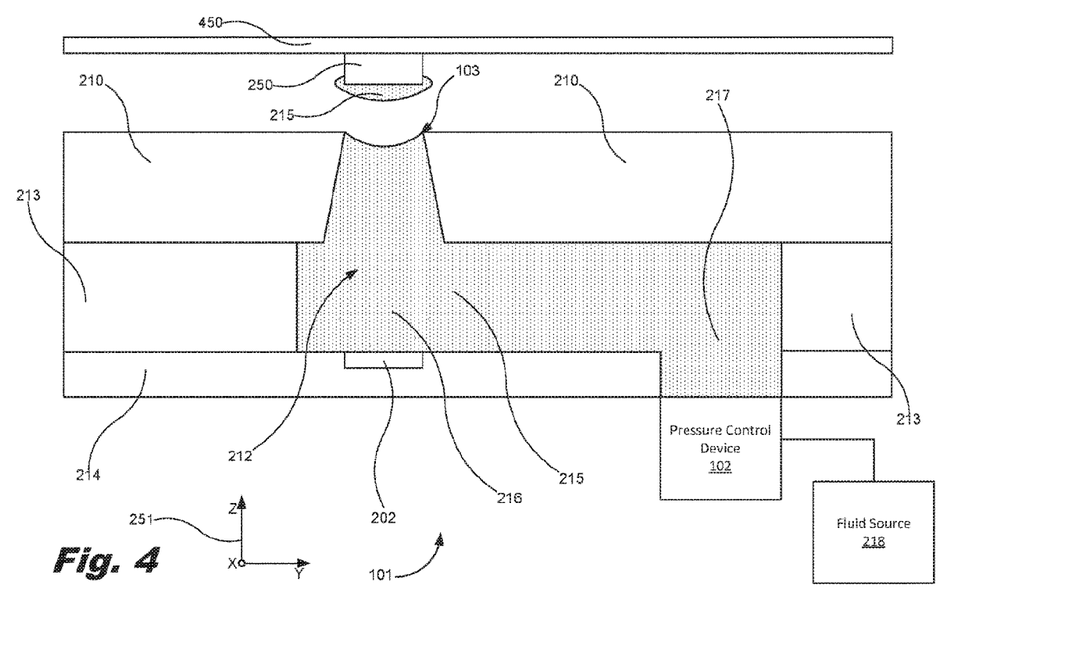
FIG. 4 is a block diagram of a portion of a printhead of the micro-structure transfer system of FIG. 1 depicting a firing of the actuator, according to another example of the principles described herein.

FIG. 2 is a block diagram of a portion of a printhead (101) of the micro-structure transfer system (100) of FIG. 1 depicting a meniscus (201), according to one example of the principles described herein. FIG. 3 is a block diagram of a portion of a printhead (101) of the micro-structure transfer system (100) of FIG. 1 depicting an adhesion of a micro-structure device (250) to a meniscus (201) formed at the printhead (101), according to another example of the principles described herein. FIG. 4 is a block diagram of a portion of a printhead (101) of the micro-structure transfer system (101) of FIG. 1 depicting a firing of the actuator (202), according to another example of the principles described herein.

As mentioned above, the printhead (101) may include an orifice plate (210) with a number of nozzles (103) defined in the orifice plate (210). The orifice plate (210) forms one side of the fluid chamber (212) with a chamber layer (213) and a printhead substrate (214) forming the other sides of the fluid chamber (212). The actuator (202) may be embedded within the printhead substrate (214), or, in another example, may be located above the printhead substrate (214). In either example, the actuator (202) pressurizes the fluid (215) within the fluid chamber (210) to create a zone (216) of pressurize fluid and cause the fluid (215) to be discharged from the printhead (101), cause the meniscus (201) to form in one example, or combinations thereof.

Fluid (215) may enter the printhead through a fluid slot (217). The fluid slot (217) is fluidically coupled to a fluid source (218) so that the fluid (215) from the fluid source (218) may be introduced onto the fluid chamber (212). The pressure control device (102) is placed between the fluid source (218) and the ink slot (217) and fluid chamber (212). At this location, the pressure control device (102) may apply pressure to the fluid (215) to form the meniscus (201). In another example, the pressure control device (102) may be coupled to or located within the fluid source (218). In the example of FIGS. 2 through 4, the pressure control device (102) is located off-axis relative to the fluid chamber (212). In this manner, the pressure control device (102) may not directly contribute to the discharge of fluid from the printhead (101), but contributes to the addition of pressure within the fluid chamber (212). In one example, the pressure control device (102) may be included within or may be a part of the fluid source (218).

Formation of the meniscus (201) via the pressure control device (102) may be defined using the following information. The pressure of the liquid (215) within the micro-structure transfer system (100) that forms the meniscus (201) may be determined as follows:

$$P_a + \frac{|\alpha|\sigma}{R} \quad \text{Eq. 1}$$

where $P_a$ is the atmospheric or ambient pressure, σ is the surface tension, R is the curvature of the meniscus, and α is the Navier-Stokes equation:

$$\alpha = \frac{P_{high} - P_a}{\rho l} \quad \text{Eq. 2}$$

where a is the fluid acceleration, $P_{high}$ is the bubble pressure, ρ is the density of the fluid (215), and l is the fluidic path length for the fluid to travel from the actuator (202) to the exit bore of the nozzle (103). The driving force for the flow of fluid (215) may be the pressure drop across the meniscus (201) as follows:

$$\Delta P = \frac{2\sigma \cos(\theta_c)}{R} - P_b \quad \text{Eq. 3}$$

where $\theta_c$ is the contact angle at which the meniscus (201) intercepts the walls of the nozzle (103).

With these equations, the pressure control device (102) may be controlled in order to selectively produce the meniscus (201). This will allow the printhead (101), with its numerous nozzles (103), to capture a number of micro-structures (250) for transfer to a target substrate (FIG. 4, 450) and deposition thereon through a fluid discharge process as depicted in FIG. 4.

As mentioned above, the pressure control device (102) causes the meniscus (201) to form at the nozzle (103). Using the adhesive properties of the fluid (215) and the protruding convex meniscus (201), the printhead (101) may be moved in direction Z as indicated by the coordinate indicator (251) toward a micro-structure (250) on, for example, a wafer (252). FIG. 3 depicts the adhesion of the micro-structure device (250) to the meniscus (201) formed at the printhead (101).

With regard to the zone (216) of pressurize fluid, the zone (216) may be created during the formation of the meniscus (201). Further, a larger or more pressurized zone (216) of pressurize fluid may be formed during a discharge of fluid from the printhead (101) using the actuator. As mentioned above, the actuator (216) in a thermal printhead may be a resistive element that heats the fluid (215) so that rapid vaporization of the fluid occurs. In this example, the zone (216) of pressurize fluid is the drive bubble referred to above that is formed as a result of the vaporization. In another example, the zone (216) of pressurize fluid may result from a piezoelectric material within a piezoelectric printhead deflecting or otherwise changing shape upon it excitation, and imparting increased pressure in the fluid (215) within the zone (216). In either example, the zone (216) of pressurized fluid may cause the fluid to be discharged out the nozzle (103).

As depicted in FIG. 4, an amount of fluid (215) is ejected from the fluid chamber (212) via the nozzle (103). This causes the micro-structure device (250) adhered to the meniscus (FIGS. 2 and 3, 201) to be fired or driven towards the target substrate (450) in the Z direction as indicated by the coordinate indicator (251). In this manner, the target substrate (450) is populated with a number of micro-structures (250). Further, because very little movement occurs between the printhead (101) and the adhered micro-structure (250), orientation of the micro-structure (250) on the printhead (101) as it is picked up, transported, and placed on the target substrate (450) is maintained. Thus, the micro-structure (250) may be easily aligned with electrical connections such as bond pads on a TFT.

In one example, the wafer (FIG. 2, 252) from which the micro-structures (250) are pick up may be a thin slice of semiconductor material upon which the micro-structures (250) were manufactured. Manufacturing of the micro-structures (250) may include, for example, doping, etching, deposition of a number of materials, photolithography, to form of the micro-structures (250) on the wafer (252). The manufacturing of the micro-structures (250) may also include performing a laser lift-off process to allow the micro-structures (250) to be removed from the surface of the wafer (252).

Further, in one example, the target substrate (FIG. 4, 450) may be a thin-film transistor (TFT). A TFT is a type of field-effect transistor made by depositing thin films of an active semiconductor layer as well as the dielectric layer and metallic contacts over a supportive, non-conducting substrate. In one example, the micro-structures (250) may be µLEDs of use in a µLED display device, as mentioned above. In this example, the µLEDs (250) may be picked up from the wafer (252) using the meniscus adhesion process described above, and deposited on the TFT (450) using the fluid ejection process described above. In some examples, ultra-high definition (UHD) µLED display devices may include millions of µLEDs (250). However, the µLEDs (250) may be used for any resolution display device including, for example, standard definition (SD) display devices, full high definition (FHD) (1080p) display devices, 4K UHD display devices, and 8K UHD display devices, among other resolutions. Depending on the resolution of the display device, the number of µLEDs (250) deposited within the display device by the micro-structure transfer system (100) may be between 4 million µLEDs (250) for lower resolution display devices to 24 million µLEDs (250) for UDH display devices. Thus, the micro-structure transfer system (100) greatly simplifies, speeds up, and perfects the placement of micro-structures (250) such as µLEDs into devices such as display devices.

Figure 5:
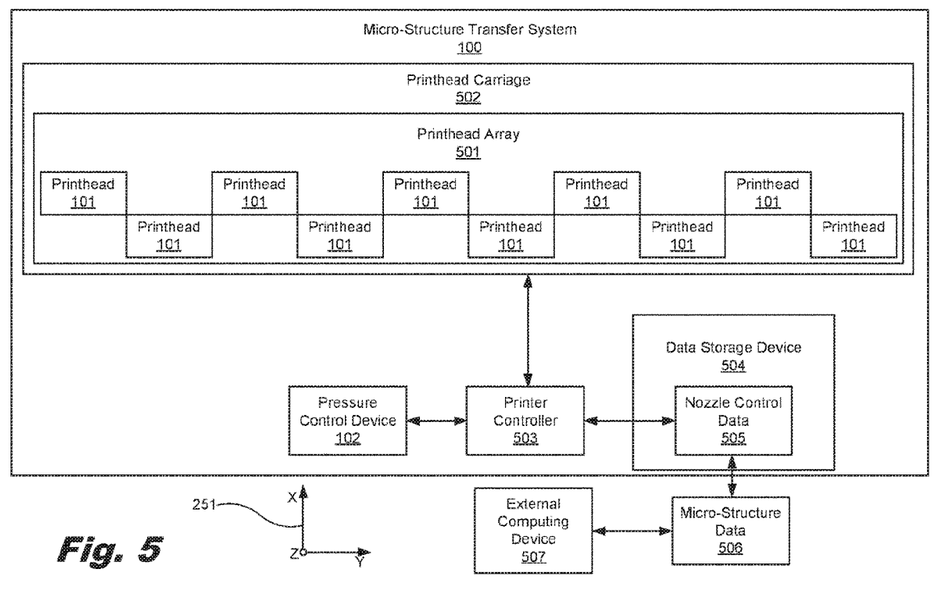
FIG. 5 is a block diagram of the micro-structure transfer system of FIG. 1, according to another example of the principles described herein.

FIG. 5 is a block diagram of the micro-structure transfer system (100) of FIG. 1, according to another example of the principles described herein. The micro-structure transfer system (100) may include a number of printheads (101) arranged in an array (501). In the example of FIG. 5, ten printheads (101) are arranged within the array (501). Each printhead (101) may include two thousand to five thousand nozzles (FIGS. 1 through 4, 103) or more which results in the ability of the micro-structure transfer system (100) to pick and place 20,000 to 50,000 or more micro-structures (250) at a time.

The array (501) may be coupled to a printhead carriage (502) that conveys or transports the array (501) in any combination of the X, Y, and Z directions as indicated by the coordinate indicator (251). Using this ability to move in any direction, the printhead carriage (502) may move to the wafer (FIG. 2, 252), pick up a number of micro-structures (250) using the meniscus adhesion process described above, move to the target substrate (FIG. 4, 450), and deposit the micro-structures (250) sing the fluid ejection process described above. With the vast numbers of micro-structures (250) that may be picked up and placed using the array (501) of the micro-structure transfer system (100), the time it takes to deposit 4 to 24 million micro-structures (250) is proportionally shortened.

To achieve its desired functionality, the micro-structure transfer system (100) includes various hardware components. Among these hardware components may be a number of printer controller (503), and a number of data storage devices (504).

The data storage device (504) may store data such as executable program code that is executed by the printer controller (503) or other processing device. As will be discussed, the data storage device (504) may specifically store computer code representing a number of applications that the printer controller (503) executes to implement at least the functionality described herein. The data storage device (504) may include various types of memory modules, including volatile and nonvolatile memory. For example, the data storage device (504) of the present example includes Random Access Memory (RAM), Read Only Memory (ROM), and Hard Disk Drive (HDD) memory. Many other types of memory may also be utilized, and the present specification contemplates the use of many varying type(s) of memory in the data storage device (504) as may suit a particular application of the principles described herein. In certain examples, different types of memory in the data storage device (504) may be used for different data storage needs. For example, in certain examples the printer controller (503) may boot from Read Only Memory (ROM), maintain nonvolatile storage in the Hard Disk Drive (HDD) memory, and execute program code stored in Random Access Memory (RAM).

The data storage device (504) may include a computer readable medium, a computer readable storage medium, or a non-transitory computer readable medium, among others. For example, the data storage device (504) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The printer controller (503) may include the hardware architecture to retrieve executable code from the data storage device (504) and execute the executable code. The executable code may, when executed by the printer controller (503), cause the printer controller (503) to implement at least the functionality of obtaining micro-structure data (506) from an external computing device (507). The micro-structure data (506) may define a location, arrangement, and operability of a number of the micro-structures (250) on the wafer (252). The micro-structure data (506) may also be referred to as wafer map information since the micro-structure data (506) defines or maps out the addresses or physical locations in space of the micro-structures (250) and identifies inoperable micro-structures (250) and their locations. The wafer map information also includes recorded information regarding which micro-structures (250) are operable or inoperable based on a wafer testing that detects the operability of the individual micro-structures (250) on the wafer.

Also, in one example, the external computing device (507) may be a computing device associated with an electrical wafer starting (EWS) or wafer testing process. EWS testing is a process performed during fabrication of semiconductor devices such as the micro-structures (250). During EWS testing, and before a wafer is sent to die preparation, a number of individual micro-structures (250) present on the wafer are tested for functional defects by applying a number of test patterns to them. The wafer testing is performed by a piece of test equipment called a wafer prober. Thus, inoperable or deficient micro-structures (250) may be identified and addressed within the array of micro-structures (250) on the wafer (FIG. 2, 252).

The executable code may, when executed by the printer controller (503), also cause the printer controller (503) to convert the micro-structure data (506) into nozzle control data (505) that is stored on the data storage device (504). The nozzle control data (505) may include an identification of each micro-structure (250) within the array of micro-structures (250) on the wafer (252), their physical location in space as defined by their address within the array of micro-structures (250) on the wafer (252), and data defining each micro-structures' (250) operability.

With the data relating to the identification and address of the micro-structures (250) on the wafer (252), the printer controller (503) may instruct the printhead array (501) to move to the micro-structures (250) on the wafer (252), align the nozzles (FIGS. 1 through 4, 103) with the micro-structures (250) on the wafer (252), and pick up a number of the micro-structures (250) from off the surface of the wafer (FIG. 2, 252).

In one example, the spacing between individual nozzles (103) on the printheads (101) may not line up with the distances between the micro-structures (250) as arranged on the wafer (FIG. 2, 252). In this example, the printer controller (503) may pick up a number of micro-structures (250) that are below the nozzles, and, in a subsequent pick up process, pick up micro-structures (250) that neighbor those micro-structures (250) already picked-up, selecting micro-structures (250) for pick up using the arrangement of the nozzles (103) as a pattern by which the micro-structures (250) are pick up from the wafer (FIG. 2, 252).

The executable code may, when executed by the printer controller (503), also cause the printer controller (503) to place the micro-structures (250) on the target substrate (FIG. 4, 450) based on address information sent to the micro-structure transfer system (100) defining addresses within space at which the micro-structures (250) are to be deposited. The addresses within space at which the micro-structures (250) are to be deposited may be stored as part of the nozzle control data (505) and utilized by the printer controller (503) during the fluid ejection process described above.

Further, the executable code may, when executed by the printer controller (503), also cause the printer controller (503) to manage inoperable micro-structures (250). As mentioned above, a number of micro-structures (250) on the wafer (252) may be identified as inoperable as defined by a EWS testing process. In operable micro-structures (250) may be identified in the micro-structure data (506) and translated into the nozzle control data (505) by the printer controller (503). With this information, the printer controller (503) may instruct the printheads (101) of the printhead array (501) to either not pick up the inoperable micro-structures (250) or pick up the inoperable micro-structures (250) and dispose of them. Thus, in one example, the printer controller (503) may instruct the printheads (101) of the printhead array (501) to not activate nozzles (103) that may be above the inoperable micro-structures (250) disposed on the wafer (252). In this example, the inoperable micro-structures (250) are simply left on the wafer (252). In another example, the printer controller (503) may instruct the printheads (101) of the printhead array (501) to move to a disposal area and deposit the inoperable micro-structures (250) in the disposal area. The disposal of the inoperable micro-structures (250) may occur before or after the deposition of the operable micro-structures (250) on the target substrate (FIG. 4, 450).

Thus, when executed by the printer controller (503), the executable code causes the printer controller (503) to implement at least the functionality provided according to the examples described herein. In the course of executing code, the printer controller (503) may receive input from and provide output to a number of other hardware units.

Having described the addressable data associated with the micro-structure data (506) and the nozzle control data (505), in one example, the spacing of the micro-structures (250) on the wafer (FIG. 2, 252) may be, for example, approximately 5 times (5×) denser than the spacing between micro-structures (250) as they are to be deposited on the target substrate (FIG. 4, 450). Thus, the micro-structure transfer system (100) may use the printer controller (503) to define the addresses in space where the micro-structures (250) are to be picked up and placed based on the micro-structure data (506) and the nozzle control data (505) in order to place the micro-structures (250) on the target substrate (450). The instructions for addresses of the placement of the micro-structures (250) on the target substrate (450) may be received from a user of the micro-structure transfer system (100) or from another computing device defining the addresses for placement of the micro-structures (250). In this manner, the micro-structure transfer system (100) provides for deposition at addressable locations.

In one example, each nozzle (103) and their respective actuators (202) within the printheads (101) may be selectively fired. In this example, any actuator (202) within a printhead (101) may be fired irrespective of the firing of other actuators (202) within the printhead (101). Selective firing of the actuators (202) allows for the ability to deposit inoperable or deficient micro-structures (250) into a disposal area. Selective firing also provides for the ability of the printheads (101) to place operable micro-structures (250) onto the target substrate (FIG. 4, 450) as defined by the nozzle control data (505). Without selective firing of the actuators (202) within a printheads (101), all the micro-structures (250) may be deposited at one time, which may not align with electrical connections located on the target substrate (FIG. 4, 450) or conform to the desired density or addressing of the micro-structures (250) on the target substrate (FIG. 4, 450).

In one example, the micro-structure transfer system (100) may deposit the micro-structures (250) on the target substrate (FIG. 4, 450) based on a desired or instructed pixel pitch for the target substrate (FIG. 4, 450). In this example, the target substrate (450) is a display device such as the UHD display devices described above. A pixel pitch is the physical distance between pixels or picture elements in a display device, and may be defined by the display device's active area divided by the number of pixels. In an example of a red, green, blue (RGB) color display device, the derived unit of pixel pitch is a measure of the size of a triad of the colors plus the distance between the triads.

Turning again to FIG. 5, the executable code may, when executed by the printer controller (503), also cause the printer controller (503) to control the pressure control device (102). As described above, the pressure control device (102) is used to form individual menisci (FIGS. 2 and 3, 201) at each of the nozzles (103). Thus, when the printer controller (503) determines that a number of micro-structures (250) are to be picked up at the wafer (FIG. 2, 252), the printer controller (503) instructs the pressure control device (102) to apply the appropriate pressure on the fluid (215) to form the menisci (FIGS. 2 and 3, 201).

Further, in one example, a combination of the pressure control device (102) and the actuators (202) within the chambers (212) of the printhead (101) may be used to form the menisci (201). In this example, the printer controller (503) controls the actuators (202) during the picking up of the micro-structures (250) to assist the pressure control device (102) in forming the menisci (201). In one example, the printer controller (503) may instruct printhead to supply approximately a 20 volt, 1.0 microsecond (μs) pulse to the actuators (202) as compared to, for example, a 35 volt, 1.5 to 3.0 μs pulse that the actuator receives during a firing of the actuator (202) during the placement of the micro-structures (250) on to the target substrate (FIG. 4, 450). Thus, the printer controller (503) may instruct printhead to supply partially actuate the actuator (202) to assist in the formation of the menisci (201) at each nozzle (103). In other examples, the printer controller (503) may instruct printhead to adjust the firing frequency of the actuator (202), the voltage supplied to the actuator (202), the current supplied to the actuator (202), the firing pulse length, other aspects of the firing of the actuator (202), or combinations thereof in order during use of a combination of the pressure control device (102) and the actuators (202) within the chambers (212) of the printhead (101) to form the menisci (201).

In still another example, the actuators (202) within the chambers (212) of the printhead (101) may be used to form the menisci (201) to provide selective pick up of the micro-structure device (250). For example, a number of the actuators (202) may be activated in an addressable manner to select those nozzles that are addressed to form the meniscus (201). In this example, the printer controller (503) controls the actuators (202) during the picking up of the micro-structures (250) to supply approximately a 20 volt, 1.0 microsecond (μs) pulse to the actuators (202) as compared to, for example, a 35 volt, 1.5 to 3.0 μs pulse that the actuator receives during a firing of the actuator (202) during the placement of the micro-structures (250) on to the target substrate (FIG. 4, 450). Thus, the printer controller (503) may instruct printhead to supply partially actuate the actuator (202) to assist in the formation of the menisci (201) at each nozzle (103). In other examples, the printer controller (503) may instruct printhead to adjust the firing frequency of the actuator (202), the voltage supplied to the actuator (202), the current supplied to the actuator (202), the firing pulse length, other aspects of the firing of the actuator (202), or combinations thereof in order during use of a combination of the pressure control device (102) and the actuators (202) within the chambers (212) of the printhead (101) to form the menisci (201). This example of addressable meniscus (201) formation through use of the actuators (202) may be used in situations where the operable micro-structure device (250) are to be selectively pick up, leaving the inoperable micro-structure device (250) on the wafer.

Figure 6:
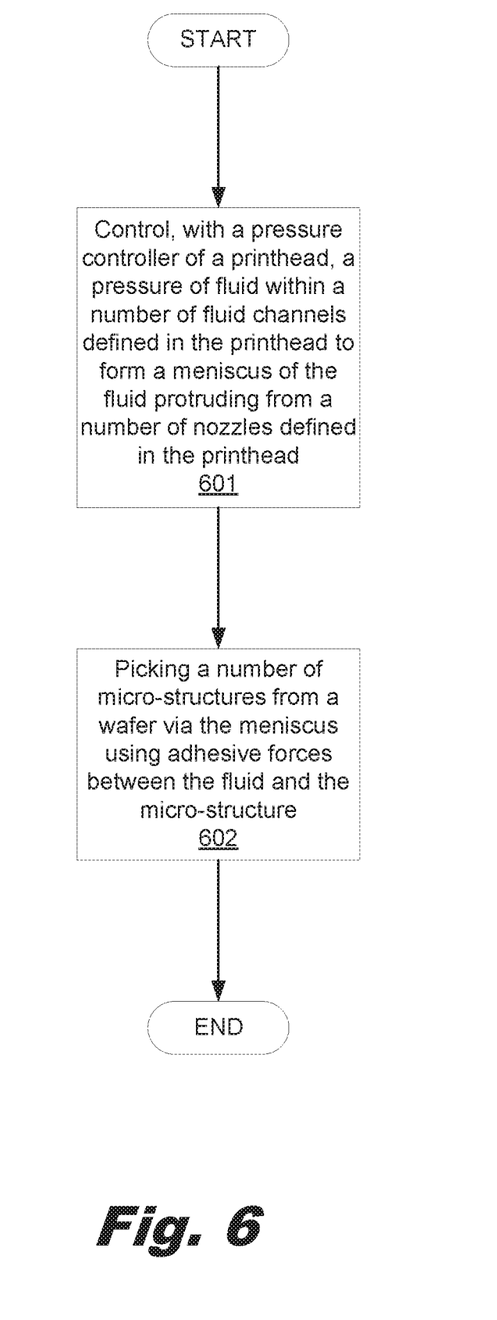
FIG. 6 is a flowchart depicting a method of transferring micro-structures, according to one example of the principles described herein.

FIG. 6 is a flowchart depicting a method of transferring micro-structures (250), according to one example of the principles described herein. The method of FIG. 6 may include, with a pressure control device (102) of a printhead (101), controlling (block 601) a pressure of fluid (215) within a number of fluid channels (217) defined in the printhead (101) to form a meniscus (201) of the fluid (215) protruding from a number of nozzles (103) defined in the printhead (101). A number of the micro-structures (250) may be picked up (block 602) from a wafer (252) via the meniscus (201) using adhesive forces between the fluid (215) and the micro-structure (250).

Figure 7:
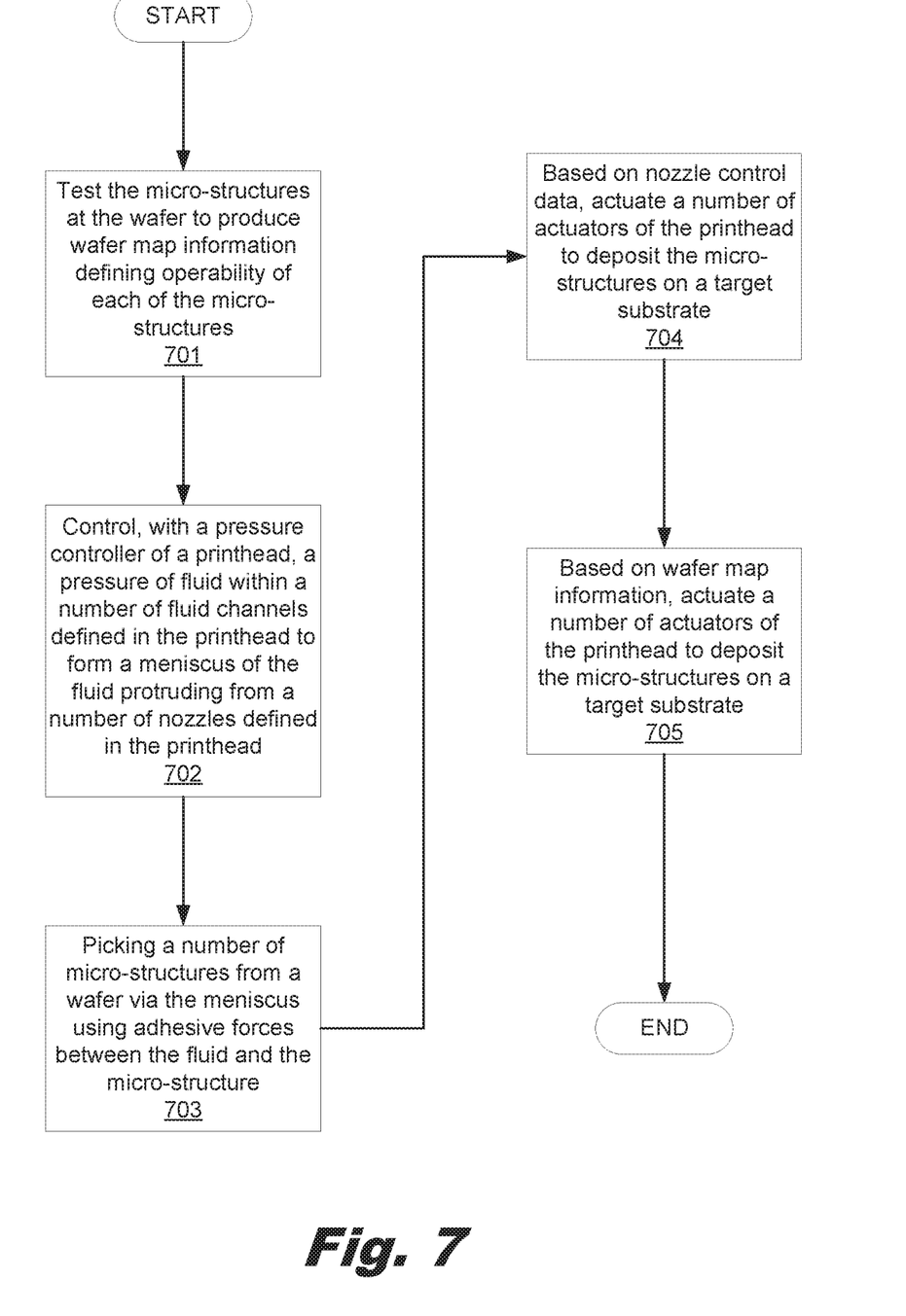
FIG. 7 is a flowchart depicting a method of transferring micro-structures, according to another example of the principles described herein.

FIG. 7 is a flowchart depicting a method of transferring micro-structures (250), according to another example of the principles described herein. The method of FIG. 7 may include testing (block 701) the micro-structures (250) at the wafer (252) to produce wafer map information (506) defining operability of each of the micro-structures (250). This information may be used to dispose of inoperable micro-structures (250) in some way.

The method may also include, with a pressure control device (102) of a printhead (101), controlling (block 702) a pressure of fluid (215) within a number of fluid channels (217) defined in the printhead (101) to form a meniscus (201) of the fluid (215) protruding from a number of nozzles (103) defined in the printhead (101). A number of the micro-structures (250) may be picked up (block 703) from a wafer (252) via the meniscus (201) using adhesive forces between the fluid (215) and the micro-structure (250).

Based on nozzle control data (505), the printer controller (503) may actuate (block 704) a number of actuators (202) to deposit the micro structures (250) on a target substrate (450). Further, based on the wafer map information (506), the printer controller (503) may cause the printheads (101) to actuate (block 705) a number of actuators (202) to deposit the micro-structures in a disposal area. As described above, the depositing of operable micro-structures (250) on the target substrate (450) may be performed before or after depositing inoperable micro-structures (250) in a disposal area. Further, deposition of the inoperable micro-structures (250) in a disposal area may include simply leaving the inoperable micro-structures (250) on the wafer (252).

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the printer controller (503) of the micro-structure transfer system (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a micro-structure transfer system may include a printhead and a pressure control device to control a pressure of fluid coupled with the printhead. The pressure control device forms a meniscus of fluid at a number of nozzles defined within the printhead to pick up a number of micro-structures. A printhead for transferring micro-structures includes a number of fluid chambers, a number of nozzles defined in an orifice plate through which fluid may exit the chambers, and a pressure control device to control a pressure of fluid within each of the chambers. The pressure control device forms a meniscus of the fluid at a number of nozzles defined within the printhead to pick up a number of micro-structures.

The micro-structure transfer system provides for the transportation of very small and difficult to handle micro-structures such as µLEDs at very small tolerances, without any post-placing processes that may be time consuming and expensive. Further, the micro-structure transfer system provides for a high throughput, inexpensive process for forming devices that include micro-structures such as, for example, high-definition display devices that include µLEDs.

The preceding description has been presented to illustrate and describe examples of the principles described. This description is not intended to be exhaustive or to limit these principles to any precise form disclosed. Many modifications and variations are possible in light of the above teaching.

What is claimed is:

1. A micro-structure transfer system comprising:
   a testing device to test micro-structures on a wafer to produce wafer map information defining operability of each of the micro-structures;
   a printhead; and
   a pressure control device to control a pressure of fluid coupled with the printhead;
   wherein the pressure control device is to form a meniscus of fluid at a number of nozzles defined within the printhead to pick up a number of micro-structures; and
   wherein the pressure control device is to handle the number of micro-structures based on the wafer map information.

2. The micro-structure transfer system of claim 1, wherein the printhead further comprises a number of fluid ejection elements to selectively deposit at least some of the micro-structures on a target substrate by ejecting the fluid through the nozzles.

3. The micro-structure transfer system of claim 2, wherein the micro-structure transfer system deposits the micro-structures on the target substrate based on a pixel pitch defining a position of the micro-structures on the target substrate.

4. The micro-structure transfer system of claim 2, wherein the fluid election elements are selectively actuated, with the pressure control device, to form the meniscus at the number of nozzles.

5. The micro-structure transfer system of claim 1, wherein the pressure control device comprises a number of pumps, a number of resistive elements, or combinations thereof to form the meniscus.

6. The micro-structure transfer system of claim 1, wherein the micro-structure transfer system, based on the wafer map information,
   actuates a number of actuators of the printhead to deposit functioning micro-structures on a target substrate; and
   actuates the actuators to deposit inoperable micro-structures in a disposal area.

7. The micro-structure transfer system of claim 6, wherein each of the actuators of the printhead are individually addressable to activate individual resistive elements based on the wafer map information.

8. The micro-structure transfer system of claim 1, further comprising a carriage to move the printhead in at least two coordinate directions.

9. The micro-structure transfer system of claim 1, wherein:
   the printhead comprises a number of fluid chambers;
   the number of nozzles are defined in an orifice plate of the printhead through which fluid may exit the chambers; and
   the pressure control device is to control a pressure of fluid within each of the chambers; and
   the pressure control device is operable to form a convex meniscus of fluid protruding from and exterior to a number of nozzles defined within the printhead to pick up the number of micro-structures.

10. The micro-structure transfer system of claim 9, further comprising a number of actuators in each of the chambers to:
    assist the pressure control device to form the meniscus; and
    create pressure within the chambers to eject fluid from the chambers through the nozzles.

11. The micro-structure transfer system of claim 10, wherein the actuators are individually selectively controlled to selectively place the micro-structures along a length of a target substrate.

12. The micro-structure transfer system of claim 1, wherein the pressure control device, based on the wafer map information, is operable to not form a meniscus at a nozzle that corresponds to an inoperable micro-structure on the wafer such that the inoperable micro-structure is left on the wafer when other, operable micro-structures are picked from the wafer by other nozzles having a meniscus.

13. The micro-structure transfer system of claim 1, wherein the pressure control device is operable to form a convex meniscus of fluid protruding from and exterior to each of the number of nozzles defined within the printhead to pick up the number of micro-structures.

14. A method of transferring micro-structures comprising:
    with a pressure control device of a printhead, controlling a pressure of fluid within a number of fluid channels defined in the printhead to form a meniscus of the fluid protruding from a number of nozzles defined in the printhead; and
    picking a number of micro-structures from a wafer via the meniscus using adhesive forces between the fluid and the micro-structure.

15. The method of claim 14, further comprising actuating a number of actuators of the printhead to deposit the micro-structures on a target substrate.

16. The method of claim 14, further comprising, with the printhead, disposing of deficient micro-structures.

17. The method of claim 14, wherein the pressure control device utilizes a number of pumps, the actuators, or combinations thereof to form the meniscus.

18. The method of claim 14, further comprising:
    testing the micro-structures at the wafer to produce wafer map information defining operability of each of the micro-structures; and
    based on wafer map information, actuating a number of actuators of the printhead to deposit the micro-structures in a disposal area.

19. The method of claim 14, further comprising picking a first number of the micro-structures from the wafer based on a pattern of the micro-structures to be formed on a target substrate and then picking a second number of the micro-structures from the wafer based on the pattern.

20. The method of claim 14, wherein the micro-structures are Light Emitting Diodes.

* * * * *